United States Patent

White et al.

[11] Patent Number: 5,352,294
[45] Date of Patent: Oct. 4, 1994

[54] ALIGNMENT OF A SHADOW FRAME AND LARGE FLAT SUBSTRATES ON A SUPPORT

[76] Inventors: John M. White, 2811 Colony View Pl., Hayward, Calif. 94541; David E. Berkstresser, 19311 Bear Creek Rd., Los Gatos, Calif. 95030; Carl T. Petersen, 1185 Gilbert Ct., Fremont, Calif. 94536

[21] Appl. No.: 10,892

[22] Filed: Jan. 28, 1993

[51] Int. Cl.$^5$ .............................................. C23C 16/00
[52] U.S. Cl. .................................... 118/725; 118/728; 118/729; 156/345; 269/56; 204/298.15; 427/248.1; 427/255.5
[58] Field of Search ................. 118/725, 728, 729; 156/345; 269/56; 204/298.15; 427/248.1, 255.5

[56] References Cited

U.S. PATENT DOCUMENTS 4,842,683  4/1988  Cheng et al. .
4,990,047  5/1989  Wagner et al. .
5,037,262  7/1989  Moll et al. .
5,090,900  9/1990  Rudolf et al. .

FOREIGN PATENT DOCUMENTS 0425779  9/1991  European Pat. Off. .

Primary Examiner—Richard Bueker

[57] ABSTRACT

Centering pins mounted to a susceptor in a vacuum chamber align a glass substrate with respect to the susceptor on which it is supported, and with respect to a shadow frame which overlies the periphery of the substrate and protects the edge and underside of the substrate from undesired processing.

Shaped pins loosely mounted in openings in the susceptor so that the pins extend above the upper surface of the susceptor support the centered glass substrate during the transporting stages, but recess into the susceptor during processing.

20 Claims, 5 Drawing Sheets

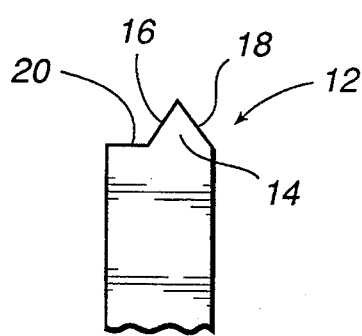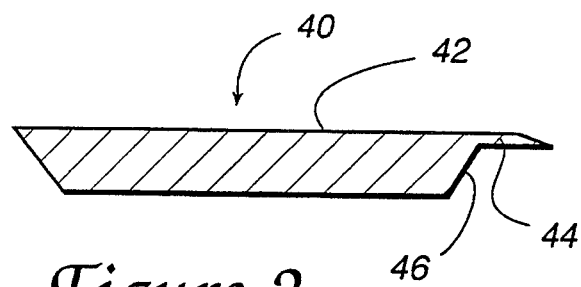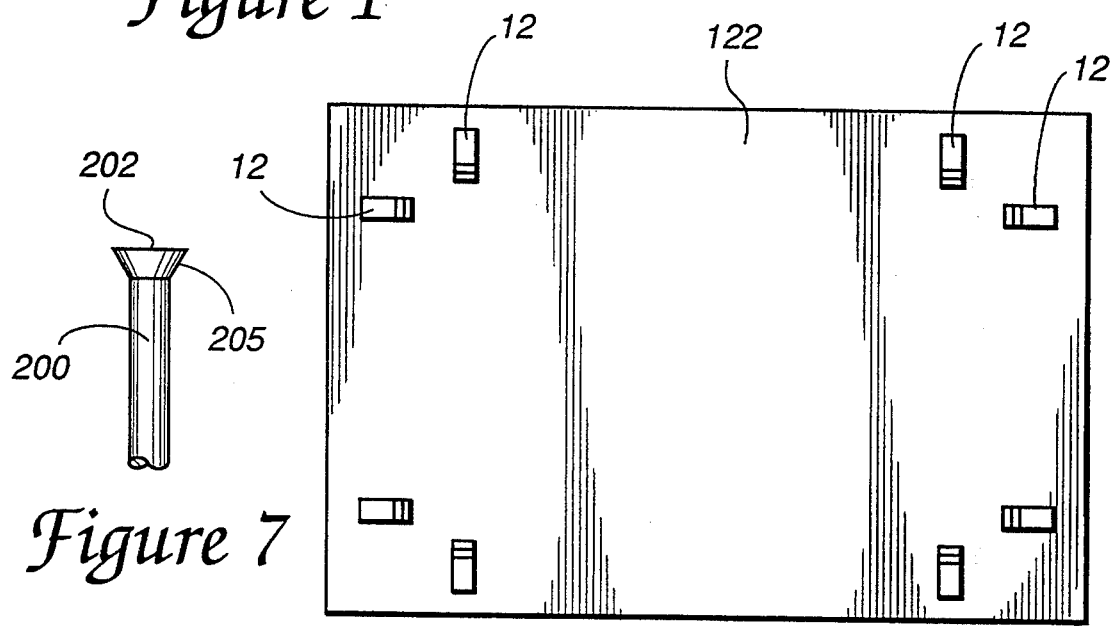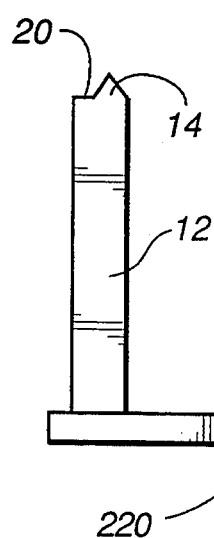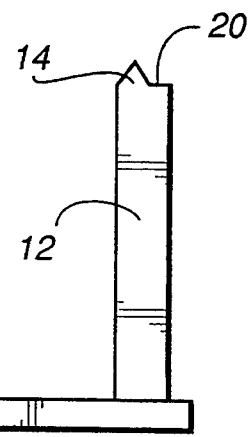

ALIGNMENT OF A SHADOW FRAME AND LARGE FLAT SUBSTRATES ON A SUPPORT

This invention relates to a method of aligning a CVD deposition mask, herein called a shadow frame, and large glass substrates on a susceptor or heated support. More particularly, this invention relates to apparatus for carrying out the alignment and support of large rectangular glass substrates, for processing and automatic exchange of the substrates into and from a processing chamber.

BACKGROUND OF THE INVENTION

The semiconductor industry has been using single substrate (silicon wafer) processing chambers for some time because the chamber volume can be minimized, contamination of the substrate has been reduced, process control is increased and, therefore, yields are improved. Further, vacuum systems have been developed, such as described in Maydan et al, U.S. Pat. No. 4,951,601, that allow several sequential processing steps to be carried out in a plurality of vacuum processing chambers connected to a central transfer chamber, so that several processing steps can be performed on a substrate without its leaving a vacuum environment. This further reduces the possibility of contamination of the substrates.

Recently the interest in providing large glass substrates with up to one million active thin film transistors thereon for applications such as active matrix TV and computer displays has been heightened. These large glass substrates, generally of a size up to about $350 \times 450 \times 1$ mm, require vacuum processing chambers for deposition of thin films thereon. The basic methods and processing chambers, e.g., plasma-enhanced chemical vapor deposition (PECVD), PVD, etch chambers and the like, are similar to those used for depositing layers and patterning thin films on silicon wafers. A practicable system that can perform multiple process steps on glass substrates is disclosed by Turner et al Serial No. 08/010,684 filed Jan. 28, 1993 in a copending application filed concurrently herewith entitled "VACUUM PROCESSING APPARATUS HAVING IMPROVED THROUGHPUT." However, because of the large size of the glass substrates, several problems have been noted in their handling and processing in vacuum processing chambers.

During processing, the edge and backside of the glass substrate must be protected from deposition. Borrowing from the semiconductor processing art, a deposition-masking ring (or in this case, a rectangle) or shadow frame is placed about the periphery of the substrate to prevent processing gases or plasma from reaching the edge and backside of the substrate in a CVD chamber for example. The susceptor, with a substrate mounted thereon, can have a shadow frame which will surround and cover several millimeters of the periphery of the front surface of the substrate and this will prevent edge and backside deposition on the substrate. If however, the shadow frame is not properly centered with respect to the substrate during processing, the amount of shadowing that occurs on each edge of the substrates will be unequal and unacceptable.

A factor complicating the alignment of the substrate to the susceptor is the following. For proper set-up, calibration, and debugging of the automated movement of a substrate into and out of a processing chamber, it is important to be able to execute these activities at room temperature. Therefore, the chamber components which provide support and alignment for the substrates must be sized and shaped to perform similarly at room temperature as at normal operating temperature. The susceptor or support for the large glass substrate, generally made of aluminum and which is heated resistively or otherwise, has a very large coefficient of thermal expansion or CTE (about $22 \times 10^{-6}/°C$.) and thus increases in size by 0.72% when heated from room temperature to a processing temperature of about 350° C. Since the type of glass in general use in the flat panel display industry has a low CTE ($4.6 \times 10^{-6}/°C$.), the size of the glass increases in size only about 0.15% from room temperature to 350° C. Because of this difference, when the glass plate and susceptor are heated to elevated temperatures, there is a significant difference in size between the glass and its susceptor support relative to the room temperature condition and it becomes difficult to center or maintain alignment of the heated glass plate on the susceptor. Again this contributes to non-uniformities in the amount of masking occurring along each edge plates and to unacceptable variations in the location of the deposition zone on the glass plate.

Therefore a means of centering a large glass substrate with respect to its susceptor support and to a shadow frame has been sought.

SUMMARY OF THE INVENTION

A centering pin assembly is mechanically registered to the center of the susceptor but independently movable to ensure both temperature-independent centering of a large glass substrate with respect to a heated susceptor and centering of a shadow frame with respect to the substrate. The shadow frame is shaped so as to mate with the centering pins, thereby also aligning the shadow frame with respect to the substrate.

Shaped support pins are loosely held in the susceptor by their own weight and are guided by closely fitting mating holes. These pins provide support for the large glass substrates during automatic exchange of the substrate and protect the susceptor from damage during periodic dry-etch cleaning cycles.

BRIEF DESCRIPTION OF THE DRAWINGS

FIG. 1 is a side view of a first embodiment of a centering pin of the invention.

FIG. 2 is a cross-sectional side view of one side of the shadow frame of the invention.

FIG. 7 is a side view of a shaped support pin of the invention.

FIG. 8 is a side view and FIG. 9 is a top view of a centering pin assembly.

DETAILED DESCRIPTION OF THE INVENTION

Figure 3:
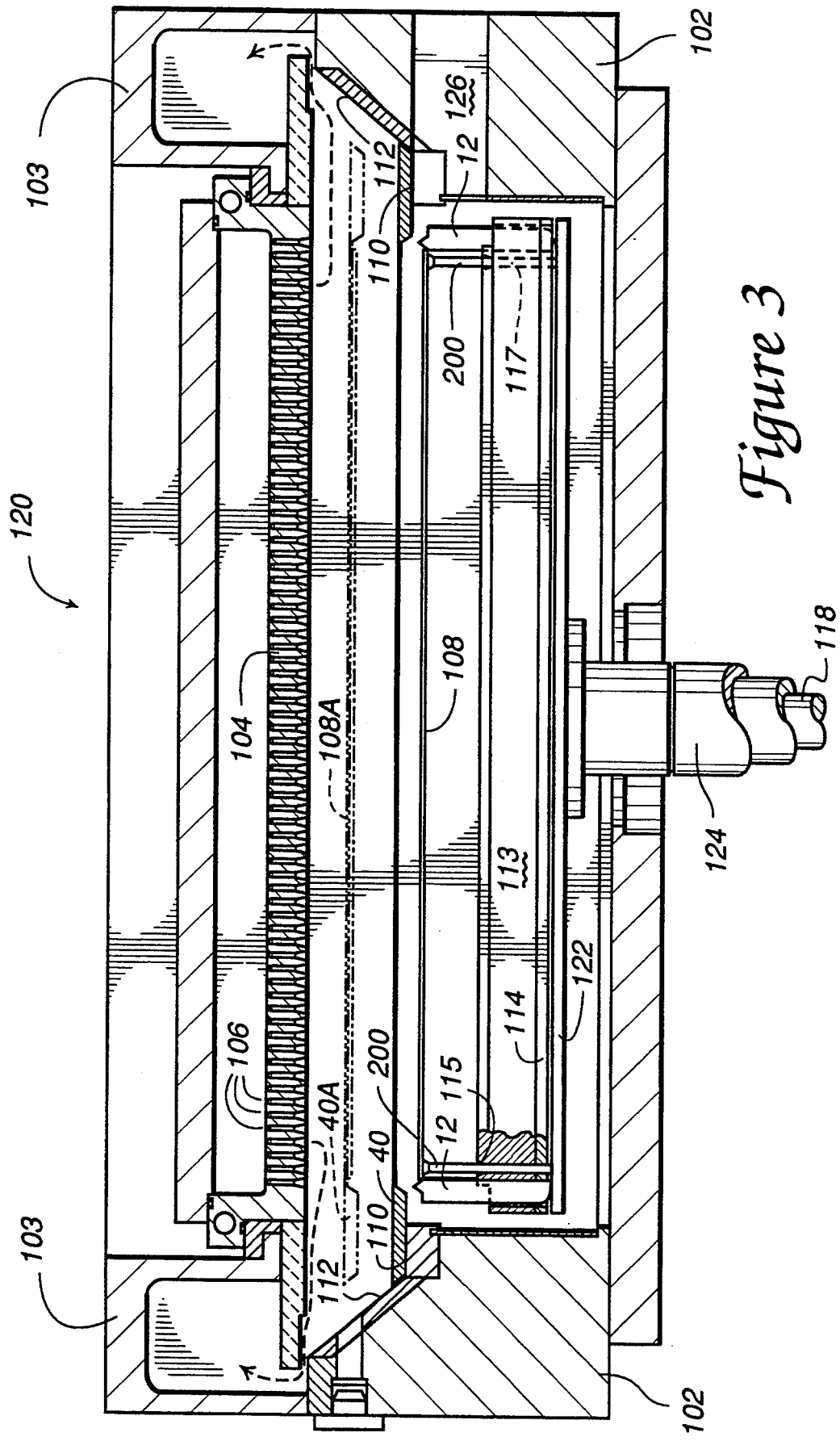
FIG. 3 is a cross-sectional view of a single substrate chemical vapor deposition (CVD) vacuum chamber for processing large glass substrates in which the centering pin assembly and shadow frame of the invention can be used.

Referring now to FIG. 1, a centering pin 12 of the invention has a top surface 20 which supports a shadow frame 40 of FIG. 2 and has extending vertically from it a triangular finger 14. The finger 14 has a first, outer edge 16 sloping in one direction that mates with and centers the shadow frame 40 with respect to the centering pin assembly 220 of FIG. 8. It further has a second, inner edge 18 sloping in another direction that, if necessary, centers a glass substrate 108 disposed on its inner side before the substrate 108 comes into contact with the susceptor 113 during a loading sequence.

FIG. 2 is a cross-sectional view of a shadow frame 40 useful herein. The shadow frame 40 comprises an upper surface 42 with a lip 44 extending horizontally therefrom which is to overlie the periphery of the glass substrate 108 to thereby protect the edge and bottom of the substrate 108 from depositions. A tapered side 46 mates with the outer sloping side 16 of the centering pin 12. The shadow frame 40 in this embodiment is either ceramic or anodized aluminum, but can be made of a number of other suitable materials.

Figure 4:
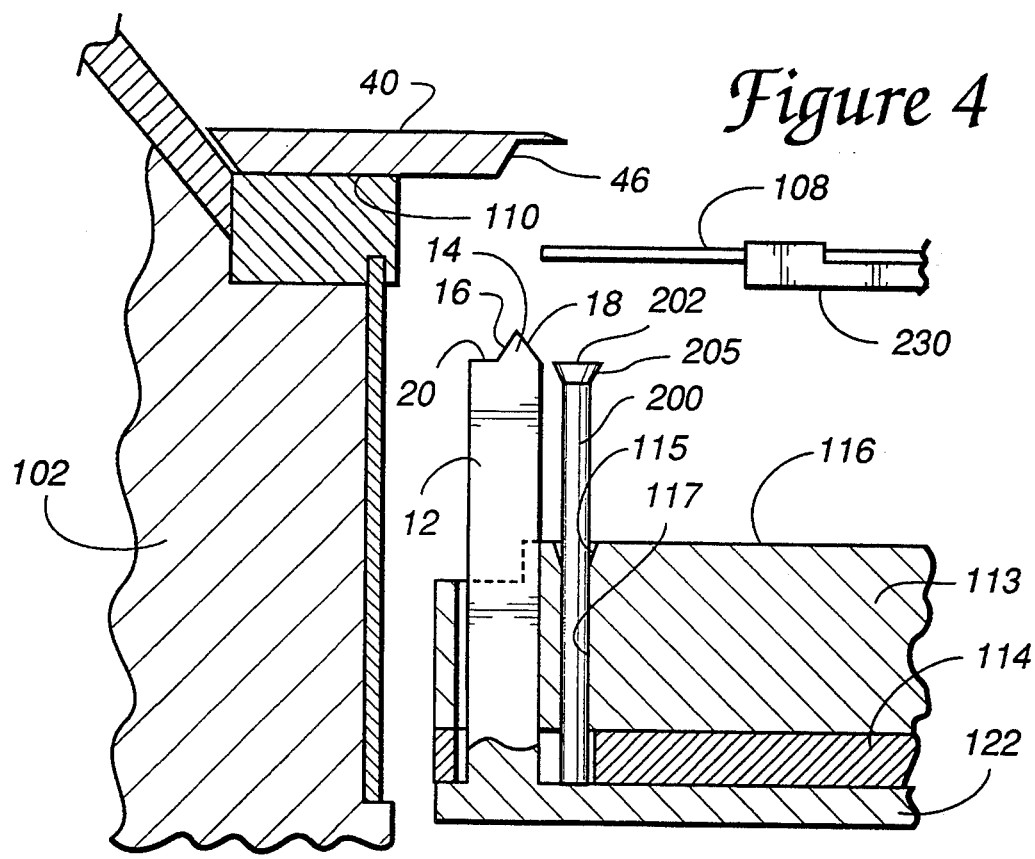
FIG. 4, 5, and 6 are three cross-sectional side views of a centering pin and its support plate, a shaped support pin, one side shadow frame, a glass substrate, the susceptor/heated support and the chamber body. The views show all of these components in their relationships to one another in the three principal positions of the active components.

Under normal circumstances, as illustrated in FIG. 4, when a robot blade 230 is inserted into a chamber with a substrate 108 atop it to load into the chamber for processing, the position of the substrate 108 is proper and located precisely enough that no centering is necessary. But in the event that some mispositioning of the substrate 108 occurs which is within the "capture window" created by the inner sloping sides 18 of two opposing centering pins 12, the substrate 108 will be centered by the substrate being guided down the slope(s) 18 of the centering pin(s) 12 as the centering pin assembly 220 moves vertically upward and lifts the substrate 108 from the robot blade 230. An obviously similar description of the function of sloping sides 16 of the centering pins 12 applies to the establishment and maintenance of the centered condition of the shadow frame 40 when, moving upward, the centering pin assembly 220 reaches the "lift" position shown in FIG. 5. The realignment of the substrate 108 and the alignment of the shadow frame 40 to the substrate 108 is passive, being gravitationally effected by the interaction of these parts with the centering pins 12.

The substrate 108 and the shadow frame 40 are thus aligned to each other and centered on the susceptor 113 by the single component, the centering pin assembly 220. This alignment is a translational alignment in both the x- and y-axes of the plane of a substrate 108 and the plane of the shadow frame 40; and it is rotational alignment about their z-axes as a result of using four pairs of opposing centering pins 12, as illustrated in plan view in FIG. 9, which are located to act near the corners of a substrate 108 and the shadow frame 40. FIG. 9 shows how the centering pins 12 are arranged in four opposing pairs (8 pins total) in order to provide centering translationally and rotationally for the rectangular substrate 108 and the shadow frame 40.

The centering pin assembly 220 and most importantly the pin support plate 122 are made of a material having a low coefficient of thermal expansion (CTE). In this embodiment it is alumina, which has a CET of about $7.4 \times 10^{-6}/°C$. and therefore exhibits a dimensional change similar to that of the glass substrate 108 of only about 0.24% from room temperature to processing temperatures of about 350° C.

FIG. 3 is a cross-sectional view of a single-substrate CVD processing chamber useful for depositing thin films onto large glass substrates and in which the novel centering pin assembly and shadow frame are used.

A vacuum chamber 120 comprises a chamber body 102 and a lid 103 attached by a hinge to the body 102. A gas dispersion plate 104 having a plurality of openings 106 therein for the distribution of reaction gases is mounted in the lid 103. The shadow frame 40 is supported by a ledge 110 on the inner surface 112 of the wall 102 during the time that the substrate 108 is entering or exiting the chamber 120 through an entry 126. The susceptor/heated support 113, mounted on ceramic support 114, can be moved up and down by a shaft 118 in conventional manner. As shown, the susceptor 113 is between its down or loading/unloading position of FIG. 4 and the lift position of FIG. 5. The susceptor 113 supports the substrate 108 to be processed on its upper surface 116 when it is in its up or processing position of FIG. 6.

A plurality of centering pins 12 rigidly mounted on the separate pin support 122 make up the centering pin assembly 220 of FIG. 9. This assembly is also movable up and down by the shaft 118 but is separately mounted on an outer shaft 124. For example, a guiding bearing on the susceptor shaft 118 allows the centering pin assembly 220 and the susceptor support 114 to be separately movable. The positions of the centering pins 12 are fixed with respect to their support 122 so that the glass substrate 108 to be processed will be centered with respect to the centering pins 12. The pin support 122 is located below the susceptor 113 and its support 114, and the centering pins 12 pass through holes in these parts.

FIG. 7 shows a shaped support pin 200, a plurality of which are used to support the substrate 108 during loading and unloading of the substrate onto and off from the robot blade 230. These pins 200 are floating under their own weight in the susceptor 113 and are forced by contact at their bottom with the centering pin support 122 to protrude through the susceptor 113 when the susceptor is in the lift position of FIG. 5 or the load position of FIG. 4. Because the component(s) (in this embodiment, the shaped pins) which lift the substrate 108 from the susceptor 113 must be beneath the substrate, (an) access hole(s) 117 must penetrate the susceptor 113 and its support 114 to allow the lifting device(s) through. However, if the hole is not covered beneath the substrate 108, several deleterious effects can occur including loss of temperature control at that spot on the substrate, and, in the case of plasma enhanced deposition or etch clean process, the discharge is greatly enhanced which is produced at such discontinuities as a hole in the surface 116 creates. Subsequent thermal or sputtering damage to the hole surfaces can result. Therefore the shaped support pins 200 are designed to float within the susceptor and be carried with the susceptor 113 as it moves above the lift position of FIG. 5 into the process position of FIG. 6. The top of the shaped support pin 200 has a tapered bottom surface 205 which fits tightly inside a mating tapered surface 115 in the susceptor 113, which thereby effectively seals the hole 117 in the susceptor 113. The shaped support pin 200 is then suspended in the susceptor 113 by the fit of support pin surface 205 inside susceptor surface 115 when the susceptor is in the process position of FIG. 6. In this position, the top surfaces 202 of the shaped support pin 200 should be either flush with or slightly under flush with the top susceptor surface 116.

The substrate load sequence is as follows. A glass substrate 108 supported by a robot blade 230 enters the vacuum chamber 120 through the entry port 126 while the susceptor 113 and centering pin assembly 220 are in the down position of FIG. 4. The shaped pins 200 contact at their lower ends the pin support plate 122 and their top surfaces 202 are generally horizontally aligned with the bottom of the inner sloping edges 18 of the centering pins 12. The centering pins 12 are raised up to support and if necessary center the glass substrate 108 with respect to the susceptor 113. In moving to the lift position of FIG. 5, the glass substrate 108 is centered by the sloping sides 18 of the centering pins and supported by the top surfaces 202 of the shaped pins 200 protruding above the susceptor 113. The robot blade 230 is withdrawn, and the entry port 126 is closed. The centering pin assembly 220 continues to move upwards along with the shaped support pins 200 until the edges 18 of the centering pins 12 contact the tapered sides 46 of the shadow frame 40. The shadow frame 40 is at once lifted upwardly away from the ledge 110 of the wall 102 and centered with respect to the shadow frame 40 and the substrate 108. The shadow fame 40 is thereby centered, if needed, and supported in its centered position as the centering pin assembly 220 is raised together with the susceptor 113 into the lift position of FIG. 5. At this point in the vertical motion, the centering pin assembly 220 reaches a stop and does not rise any higher. The susceptor 113 is now raised until it supports the glass plate 108 and the lip 44 of the shadow frame 40, so that the shadow frame 40 is now supported solely by the substrate 108. At this point, the shaped pins 200 are lifted off the pin support plate 122 by the rising susceptor 113 and become flush with the top susceptor surface 116. The final processing position of the glass substrate and the shadow frame is shown by means of dotted lines at 108A and 40A in FIG. 3 and in detail in FIG. 6. Since the glass substrate 108 and the shadow frame 40 can be made to have similar coefficients of thermal expansion, their relative size does not change with respect to each other during processing and the shadow frame 40 remains centered with respect to the substrate 108.

The reactant gases are fed through the gas dispersion plate 104 and processing is completed. The susceptor 113, the substrate 108 and the shadow frame 40 are then lowered to the lift position of FIG. 5, whereat the robot blade 230 is inserted. The susceptor 113 and centering pin assembly 220 then are lowered together. The substrate 108 deposited on the robot blade and the processed glass substrate can be removed from the chamber 120.

Figure 5:
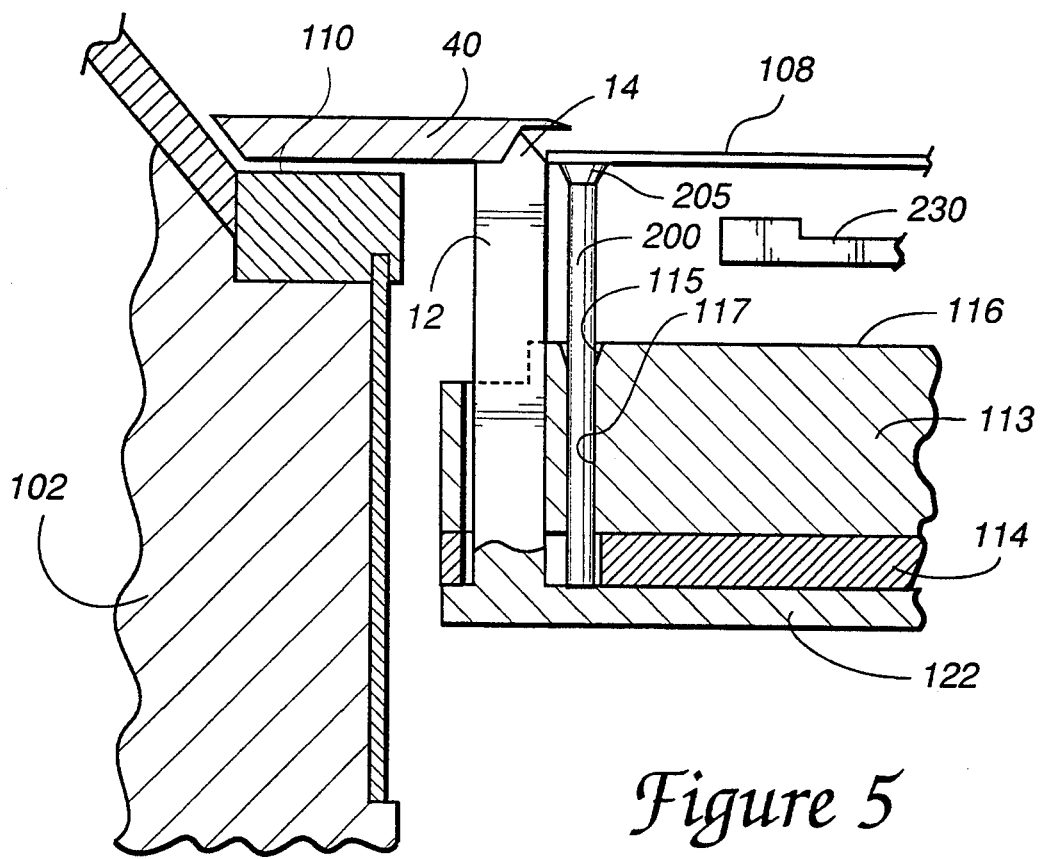
Figure 6:
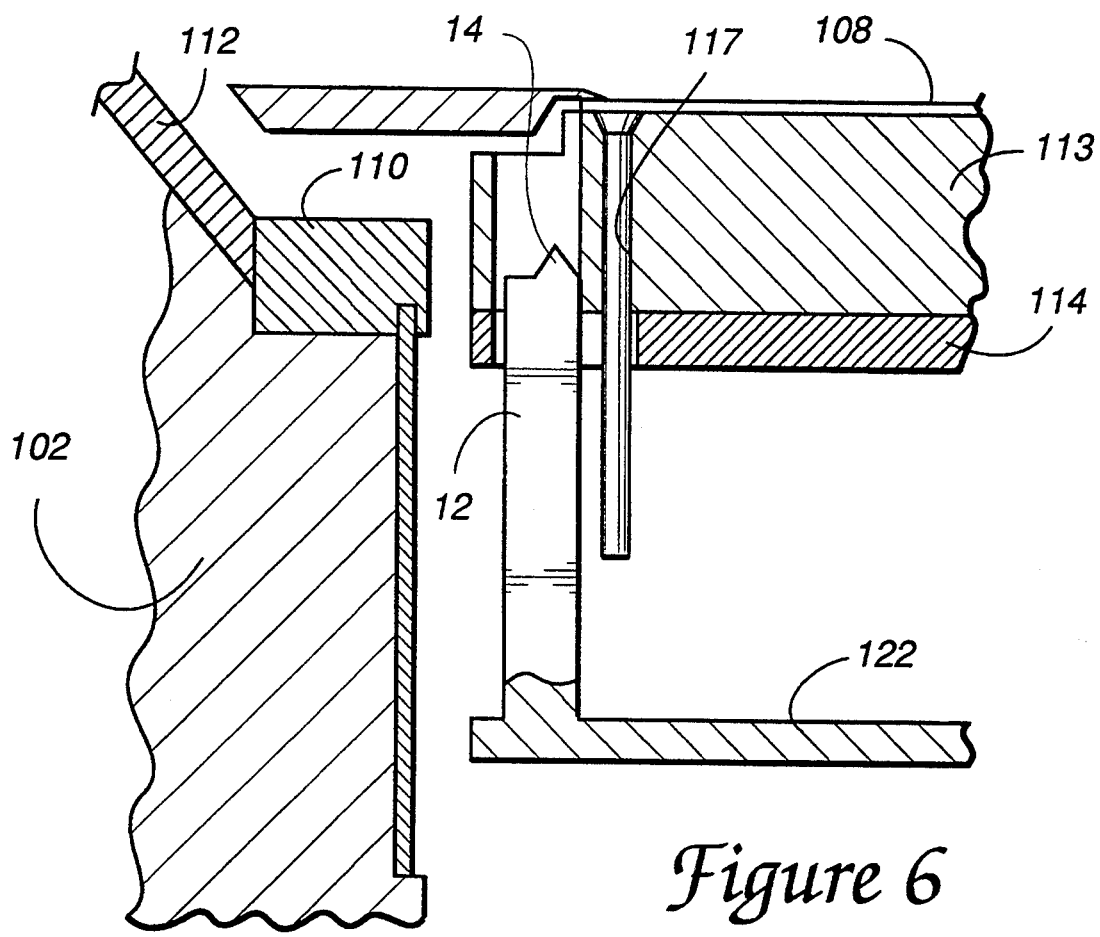
Figure 10:
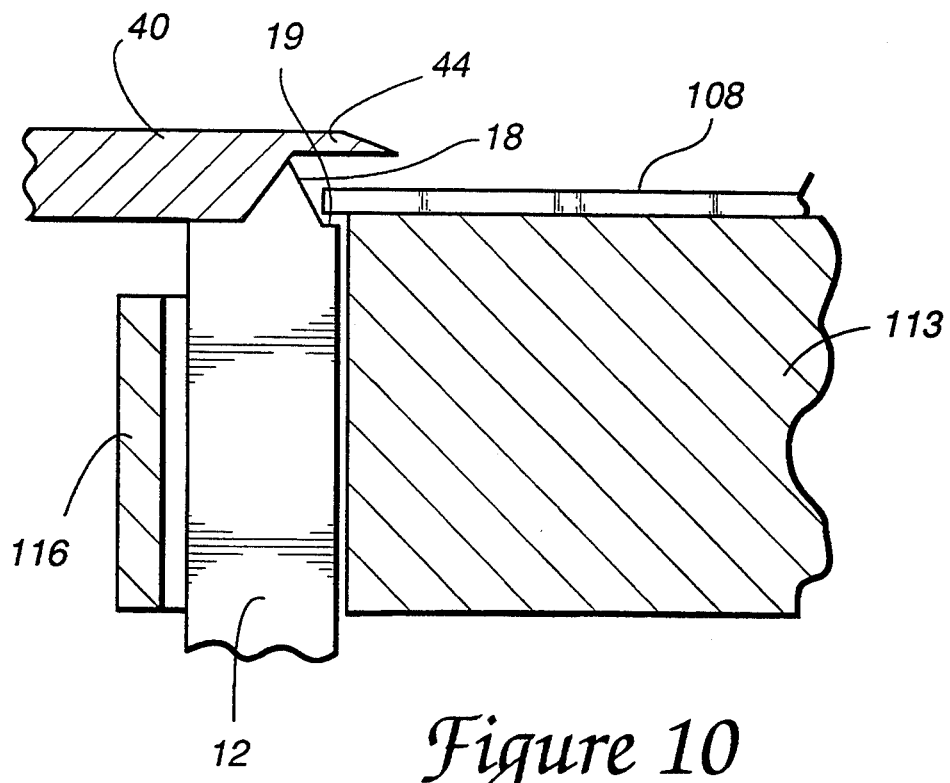
FIG. 10 is a side view of a second embodiment of the centering pin.

A simpler but less preferred embodiment of the invention is illustrated in FIG. 10. When the robot arm 230 places the substrate 108 within the chamber, the sloping inner sidewalls 18 center the substrate 108 as the centering assembly 220 is raised. The centered substrate 108 rests on inner, horizontally extending ledges 19 of the centering pins 12 before the susceptor 113 lifts the substrate 108 from the inner ledges 19 to engage and lift the shadow frame 40 from the centering pins 12. The embodiment of FIG. 10 does not require the shaped pins 200 because the inner ledges 19 perform the substrate-support function of the shaped pins 200, as shown in FIG. 5. However, the holes 117 in the susceptor 113 which allow the centering pins 12 to pass through must extend correspondingly further toward the center of the susceptor 113, and therefore the frame lip 44 must be longer if it is to cover the larger hole in the susceptor 113. The longer lip 44 however has the undesirable effect of reducing the usable processed area of the glass 108, and, as previously described, the uncovered hole can have deleterious effects on the substrate 108 or the susceptor 113.

Figure 11:
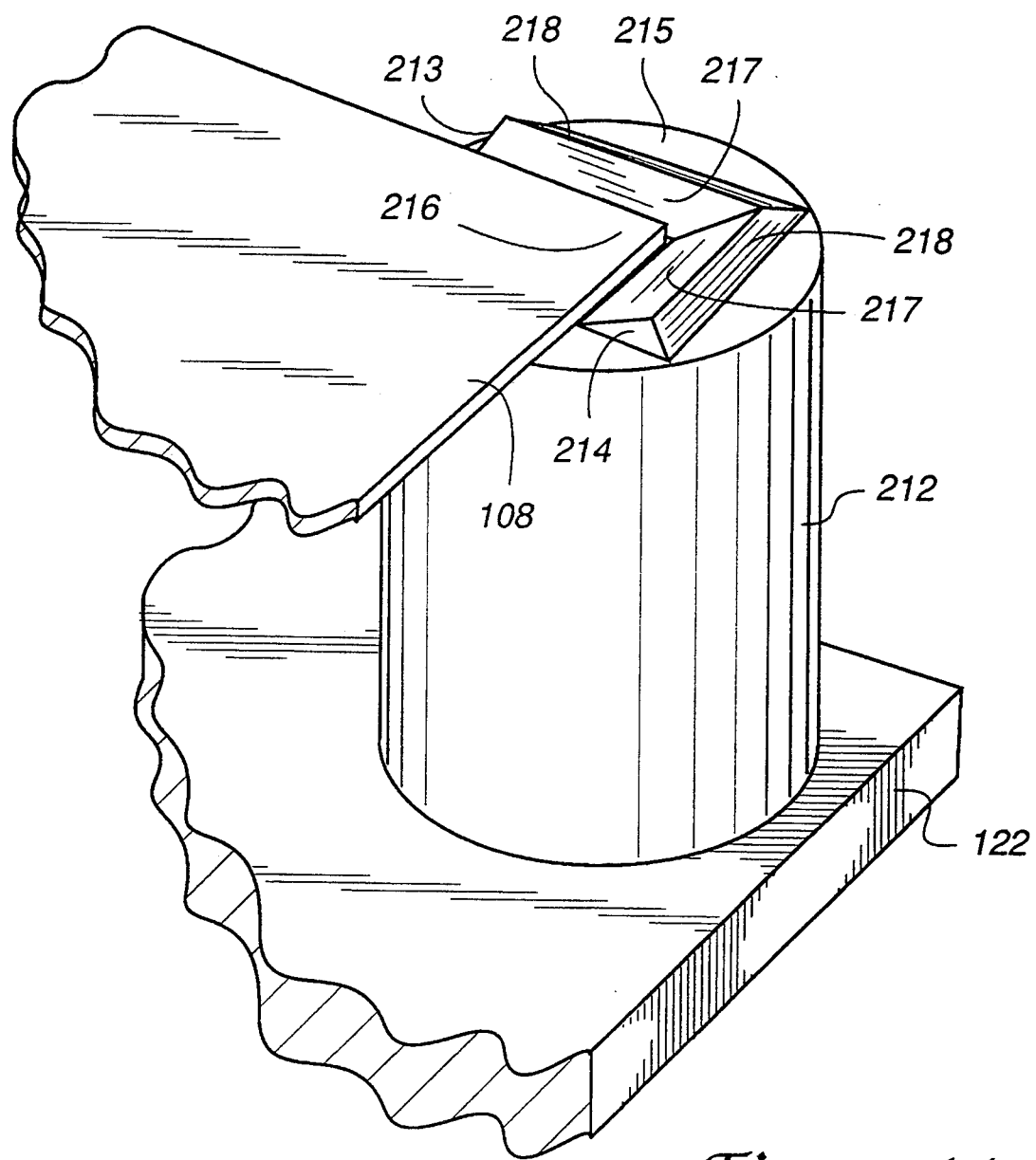
FIG. 11 is a three-dimensional view of a third embodiment of the centering pin.

A third embodiment of the invention is illustrated in three dimensions in FIG. 11. Four corner pins 212 rise from the four corners of the pin support plate 122. The intervening susceptor in not illustrated. Two perpendicular triangular wedges 213 and 214 rise from a flat surface 215 at the top of the corner pins 212. The substrate 108 is centered at its corners 216 by the inner sloping surfaces 217 of the wedges 213 and 214, and its corners 216 are supported by the inner portions of the top pin surface 215. The masking frame 40 is centered by the outer sloping surfaces 218 of the corner pins 212 and is supported by the outer portions of the top pin surfaces 215. Four such corner pins 212 perform the same functions as four pairs of centering pins 12 of FIG. 10.

Although the invention is described herein in terms of certain specific embodiments, the centering pins, shadow frame and support pins can be employed in apparatus other than CVD chambers and various materials and chamber parts may be substituted as will be known to one skilled in the art. The invention is meant to be limited only by the scope of the appended claims.

What is claimed is:

1. In a vacuum processing chamber for processing a substrate comprising a substrate support for said substrate that is movable in a vertical direction, the improvement which comprises:
   a shadow frame for contacting an outer periphery of said substrate for preventing processing of a backside of said substrate; and
   a plurality of vertically extending fingers each having an outside sidewall for mating with said shadow frame and an inside sidewall for mating with said substrate, thereby aligning said shadow mask with said substrate.

2. The improvement of claim 1, wherein said substrate comprises a glass, and a laterally extending support for said fingers comprises a material having a coefficient of thermal expansion substantially closer to a coefficient of thermal expansion of said glass than to a coefficient of thermal expansion of a metal of which said substrate support is principally comprised.

3. The improvement of claim 1, further comprising:
   a vertically movable pin support; and
   a plurality of vertically extending pins attached to said pin support and each having one of said fingers on an upper surface thereof.

4. The improvement of claim 3:
   wherein said shadow frame has a lower outwardly extending horizontal surface, a lower inwardly extending horizontal surface vertically above said outwardly extending horizontal surface for contacting an upper periphery of said substrate, and a sloping surface connecting said inwardly and upwardly extending horizontal surfaces; and
   wherein each of said upper surfaces of said pins has a surface extending horizontally outwardly from said finger of said each pin for engaging said outwardly extending horizontal surface of said shadow frame.

5. The improvement of claim 4, wherein each of said upper surfaces of said pins has a surface extending horizontally inwardly from said finger of said each pin for supporting said substrate.

6. The improvement of claim 1, further comprising a plurality of shaped pins having axially extending lower portions and outwardly extending upper portions, said lower portions being slidably fitted into apertures formed in said substrate support, said upper portions extendable vertically above an upper face of said substrate support.

7. The improvement of claim 6, further comprising a vertically movable finger support for supporting said fingers, and wherein said upper portions of said shaped pins recede within said substrate holder when said substrate holder and said finger support are relatively far apart vertically, and wherein said upper portions extend from said substrate holder and said lower portions contact said finger support when said substrate holder and said finger support are relatively close vertically.

8. The improvement of claim 7, wherein said upper portions of said shaped pins are conically shaped and said apertures in said substrate support are correspondingly countersunk.

9. The improvement of claim 3, comprising at least four opposing pairs of said pins, each rectangular side of said pin support having at least two of said pins.

10. The improvement of claim 3, wherein said fingers are wedge-shaped, four of said pins are arranged to support corners of said substrate, and two said wedge-shaped fingers perpendicularly extend on said upper surface of each said pin.

11. A processing system, comprising:
   a controlled environment processing chamber having a port for receiving a substrate;
   a vertically movable pin support;
   a plurality of vertically extending centering pins attached to said pin support, each said centering pin comprising a triangular finger with inner and outer oppositely sloping edges extending above said pin, said inner sloping edges being sized to receive said substrate;
   a vertically movable substrate holder capable of lifting said substrate from said centering pins;
   a shadow frame having a lower sloping surface for mating with said outer sloping edges of said fingers and an inner horizontally extending lower surface for covering an upper periphery of said substrate when said substrate holder lifts said substrate from said centering pins.

12. A system as recited in claim 11, wherein said substrate holder includes a plurality of vertically extending apertures and further comprising a plurality of shaped pins having lower portions slidably fitted in said apertures and upper outwardly extending portions vertically extensible above said substrate holder for supporting said substrate.

13. A system as recited in claim 12, wherein said shaped pins have conical heads and said apertures have countersinks to receive said conical heads so as to effectively close the apertures.

14. A method of loading and centering a substrate in a processing chamber, comprising the steps of:
   loading a substrate through a port of said processing chamber onto a plurality of centering pins carried by a pin support, said centering pins having first sloping surfaces for laterally centering said substrate;
   moving said pin support vertically upward to engage a shadow frame having a central aperture, mating surfaces of said centering pins and said shadow frame laterally centering said shadow mask; and
   moving a substrate holder vertically upward to lift said substrate and further moving said substrate holder further vertically upward to engage said shadow mask with an upper surface of said substrate to thereby lift said shadow mask from said centering pins.

15. A method as recited in claim 14, wherein said shadow frame has a first sloping one of said mating surfaces and said centering pins have second sloping ones of said mating surfaces.

16. A method as recited in claim 14, wherein said loading step loads said centered substrate onto members extending from said pin support.

17. A method as recited in claim 16, wherein said members are rigidly connected to said pin support whereby said step of moving said substrate holder lifts said substrate from said members.

18. A method as recited in claim 16, wherein said members are detachably connected to said pin support and slide in said substrate holder up to a limit, whereby said step of moving said substrate holder separates said members from said pin support.

19. A method as recited in claim 14, wherein a gravitational attraction alone of said substrate against said centering pins provides a capture window for said substrate misaligned within a capture window by said loading step.

20. A method as recited in claim 19, wherein a gravitational attraction alone of said shadow mask against said centering pin aligns said shadow mask with said substrate.

* * * * *